(12) United States Patent
Shin

(10) Patent No.: US 8,378,569 B2
(45) Date of Patent: Feb. 19, 2013

(54) ORGANIC LIGHT EMITTING DIODE DISPLAY HAVING IMPROVED STRENGTH BY PREVENTING THE EXFOLIATION OF A SEALANT

(75) Inventor: Hye-Jin Shin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 543 days.

(21) Appl. No.: 12/470,013

(22) Filed: May 21, 2009

(65) Prior Publication Data

US 2010/0109512 A1    May 6, 2010

(30) Foreign Application Priority Data

Nov. 5, 2008  (KR) ............................... 2008-109449

(51) Int. Cl.
*H01J 1/62* (2006.01)
*H01J 9/00* (2006.01)

(52) U.S. Cl. ........ 313/504; 313/507; 313/508; 313/512; 445/24

(58) Field of Classification Search .......... 313/500–512; 315/169.1
See application file for complete search history.

(56) References Cited

U.S. PATENT DOCUMENTS

| 6,239,854 | B1 * | 5/2001 | Hirakata et al. | 349/149 |
|---|---|---|---|---|
| 7,385,347 | B2 * | 6/2008 | Song et al. | 313/504 |
| 2005/0023956 | A1 * | 2/2005 | Kwak et al. | 313/495 |
| 2005/0110014 | A1 * | 5/2005 | Park et al. | 257/59 |
| 2005/0140273 | A1 * | 6/2005 | Guo et al. | 313/504 |
| 2006/0027838 | A1 * | 2/2006 | Koo et al. | 257/257 |
| 2006/0145983 | A1 * | 7/2006 | Lee et al. | 345/92 |
| 2006/0232197 | A1 * | 10/2006 | Lee | 313/504 |
| 2007/0087616 | A1 * | 4/2007 | Sakakura et al. | 439/395 |
| 2007/0159099 | A1 * | 7/2007 | Takahashi et al. | 313/512 |
| 2008/0283838 | A1 * | 11/2008 | Ishikawa | 257/59 |

FOREIGN PATENT DOCUMENTS

| JP | 2005-251630 | 9/2005 |
|---|---|---|
| KR | 10-0671638 | 1/2007 |
| KR | 10-2007-0078504 | 8/2007 |
| KR | 10-0897157 | 5/2009 |

* cited by examiner

*Primary Examiner* — Tracie Y Green
(74) *Attorney, Agent, or Firm* — Robert E. Bushnell, Esq.

(57) ABSTRACT

An organic light emitting diode (OLED) display. The OLED display includes a first substrate member, a first conductive wire having a contact region and formed over the first substrate member, an insulating layer including a plurality of wire contact holes exposing a part of the contact region of the first conductive wire and formed over the first conductive wire, a second conductive wire formed over the first conductive wire and connected to the first conductive wire through the plurality of wire contact holes of the insulating layer, a sealant formed over the second conductive wire, a sealing member formed over the sealant, and a fill-up layer disposed above or under the contact region of the first conductive wire.

20 Claims, 7 Drawing Sheets

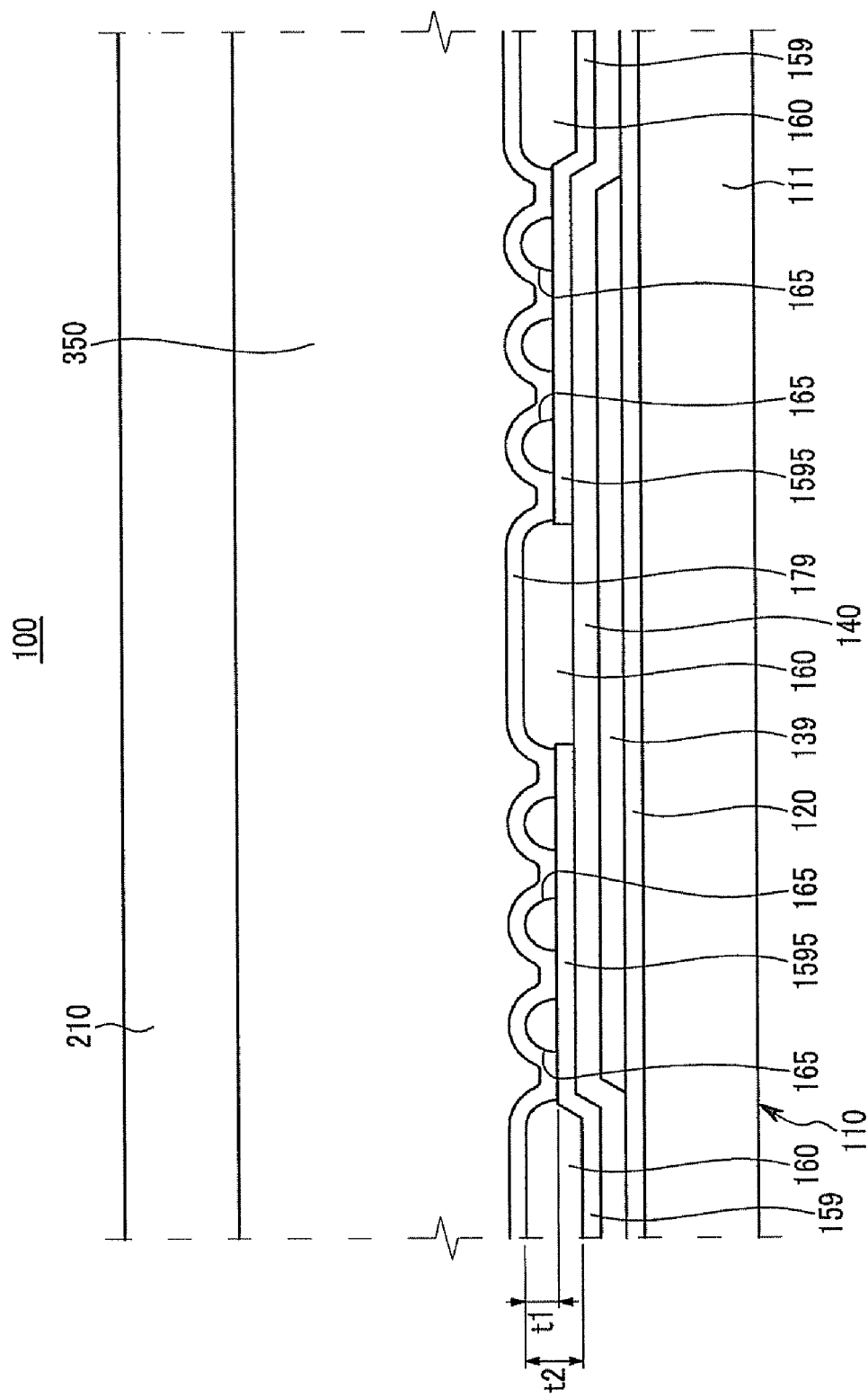

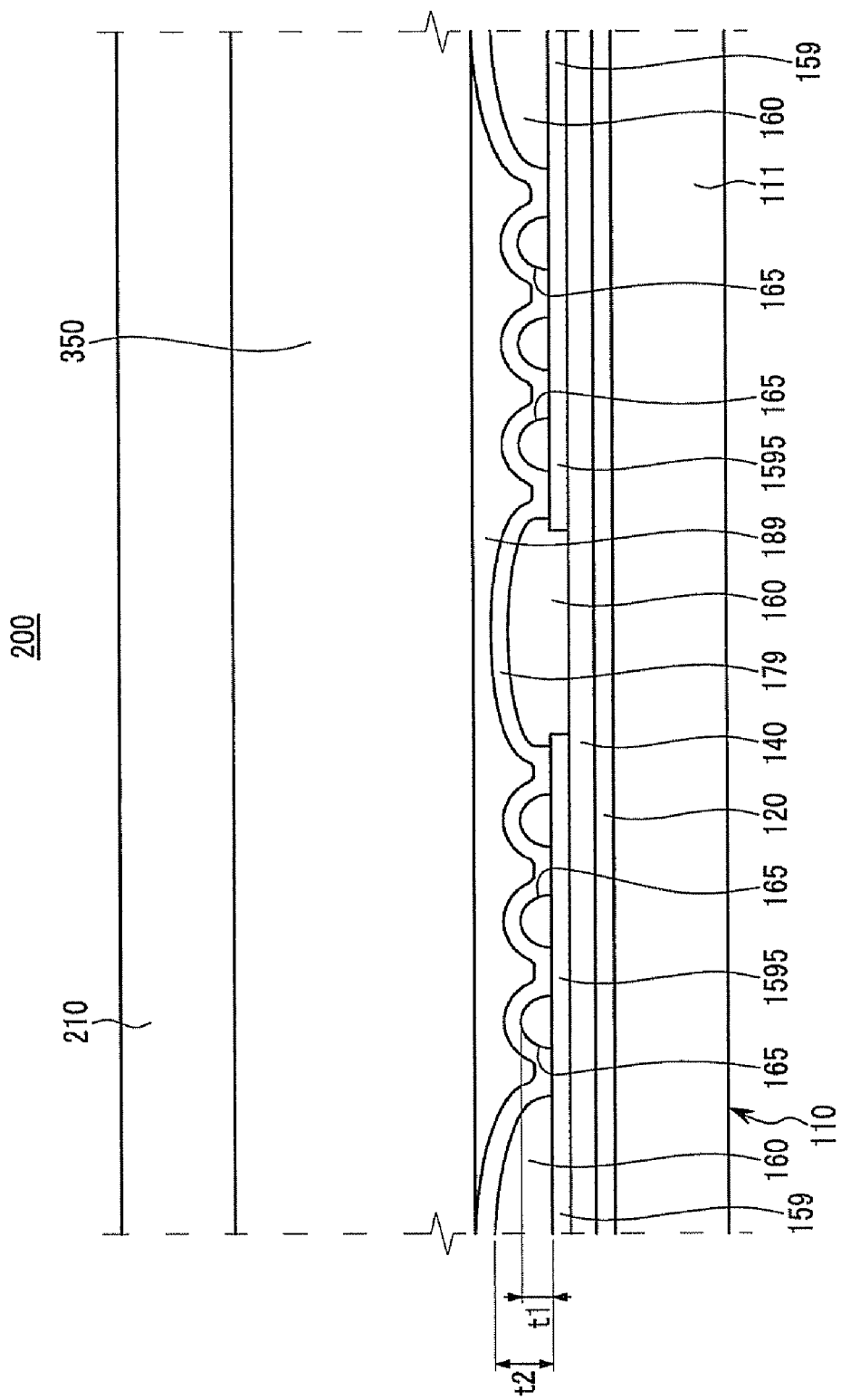

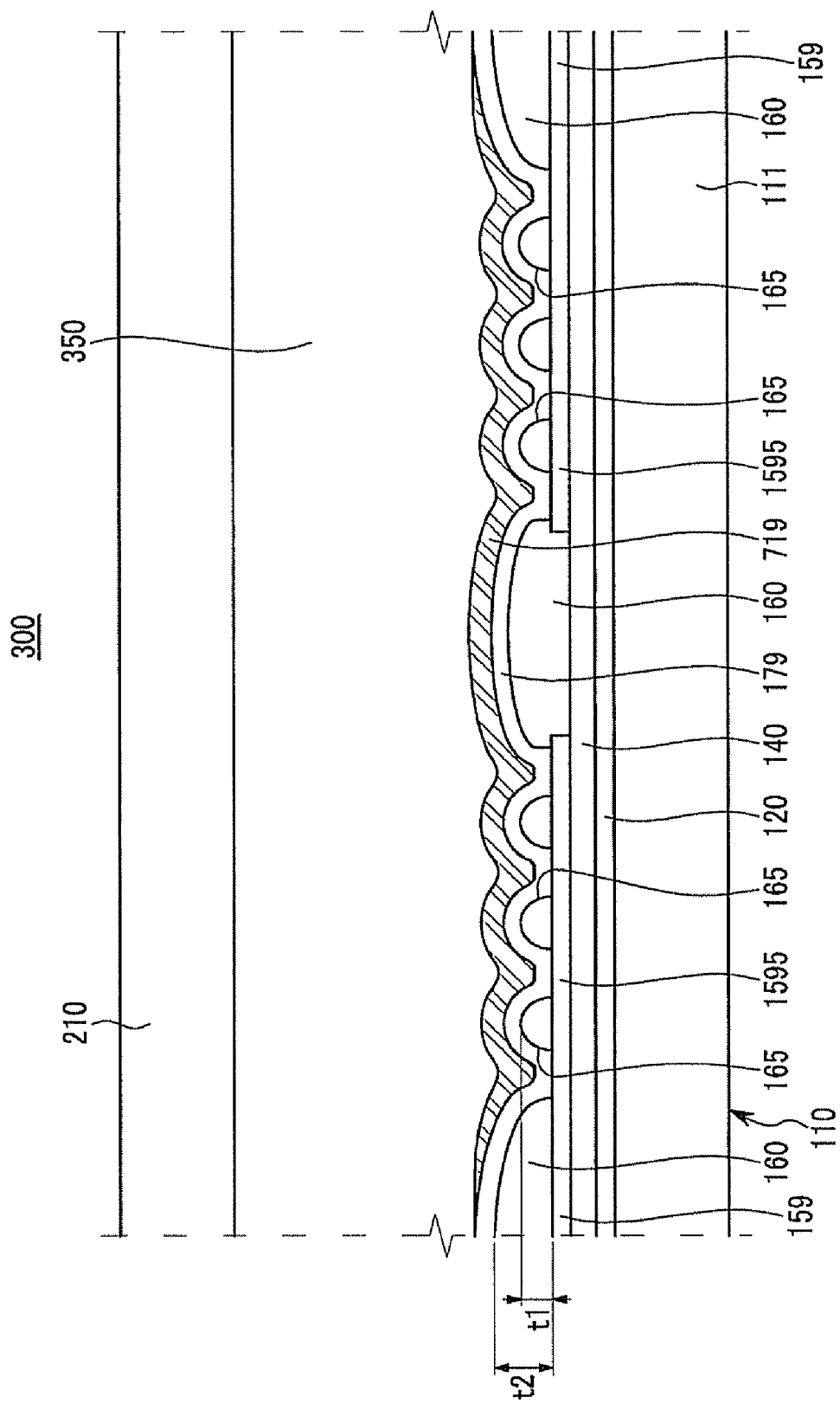

US 8,378,569 B2

ORGANIC LIGHT EMITTING DIODE DISPLAY HAVING IMPROVED STRENGTH BY PREVENTING THE EXFOLIATION OF A SEALANT

CROSS-REFERENCE TO RELATED APPLICATION

This application claims the benefit of Korean Patent Application No. 2008-109449 filed Nov. 5, 2008, in the Korean Intellectual Property Office, the disclosure of which is incorporated herein by reference.

BACKGROUND OF THE INVENTION

1. Field of the Invention

Aspects of the present invention relate to an organic light emitting diode (OLED) display. More particularly, aspects of the present invention relate to an organic light emitting diode (OLED) display with improved strength.

2. Description of the Related Art

An organic light emitting diode (OLED) display has a self-emissive characteristic and does not require an additional light source, unlike a liquid crystal display. Therefore, the OLED display can be reduced in thickness and weight. Also, the OLED display has been receiving attention as a next generation portable display device because the OLED display has high definition characteristics and low power consumption, high luminance, and fast reaction speed.

In general, a mother panel of an OLED display is initially manufactured, and then the mother panel is divided into a plurality of OLED displays. An image quality test and an aging process are performed on the mother panel. In order to perform these processes, testing/aging wires are formed along edges of each OLED display.

An OLED display includes a display substrate having thin film transistors and organic light emitting diodes, a sealing member for covering the display substrate, and a sealant for making the display substrate cohere with the sealing member. Here, the sealant is coated along an edge of the sealing member for sealing a space between the display substrate and the sealing member.

Therefore, the testing/aging wires overlap with the sealant at the edge of the OLED. Furthermore, the adhesion of the sealant deteriorates by a step difference generated by the testing/aging wires, and the sealing member may separate from the display substrate in the OLED display.

The above information disclosed in this Background section is only for enhancement of understanding of the background of the invention and therefore it may contain information that does not form the prior art that is already known to a person of ordinary skill in the art.

SUMMARY OF THE INVENTION

Aspects of the present invention provide an organic light emitting diode (OLED) display having improved strength by suppressing exfoliation.

An exemplary embodiment of the present invention provides an organic light emitting diode (OLED) display including a first substrate member, a first conductive wire having a contact region formed over the first substrate member, an insulating layer including a plurality of wire contact holes that expose a part of the contact region of the first conductive wire formed over the first conductive wire, a second conductive wire formed over the first conductive wire connected to the first conductive wire through the plurality of wire contact holes of the insulating layer, a sealant formed over the second conductive wire, a sealing member formed over the sealant, and a fill-up layer disposed above or under the contact region of the first conductive wire.

The insulating layer formed over the contact region may be thinner than an average thickness of the insulating layer.

The first conductive wire may be broken at regular intervals.

The contact region may be at an end of the broken first conductive wire.

The first conductive wire may include at least one metal of chromium (Cr), molybdenum (Mo), titanium (Ti), or tantalum (Ta).

The first conductive wire and the second conductive wire may be formed to be flat.

The fill-up layer may be disposed under the first conductive wire.

The OLED display may further include a thin film transistor having a semiconductor layer, and the fill-up layer may be formed of the same material as that of the semiconductor layer of the thin film transistor through the same manufacturing process The fill-up layer may be disposed over the first conductive wire.

The OLED display may further include a thin film transistor, an organic light emitting diode, and a planarization layer disposed between the thin film transistor and the organic light emitting diode. The fill-up layer may be formed of the same material as that of the planarization layer through the same manufacturing process.

The OLED may further include an organic light emitting diode having a first electrode, an organic emission layer formed over the first electrode, and a second electrode formed over the organic emission layer. The fill-up layer may be formed of the same material as that of the first electrode of the organic light emitting diode through the same manufacturing process.

According to aspects of the present invention, the strength of the OLED display can improve by suppressing exfoliation.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 5 is a cross-sectional view of FIG. 4 along the line V-V;

FIG. 6 is a partial cross-sectional view of an organic light emitting diode (OLED) display according to the second exemplary embodiment of the present invention; and FIG. 7 is a partial cross-sectional view of an organic light emitting diode (OLED) display according to the third exemplary embodiment of the present invention.

DETAILED DESCRIPTION OF THE EMBODIMENTS

Figure 1:
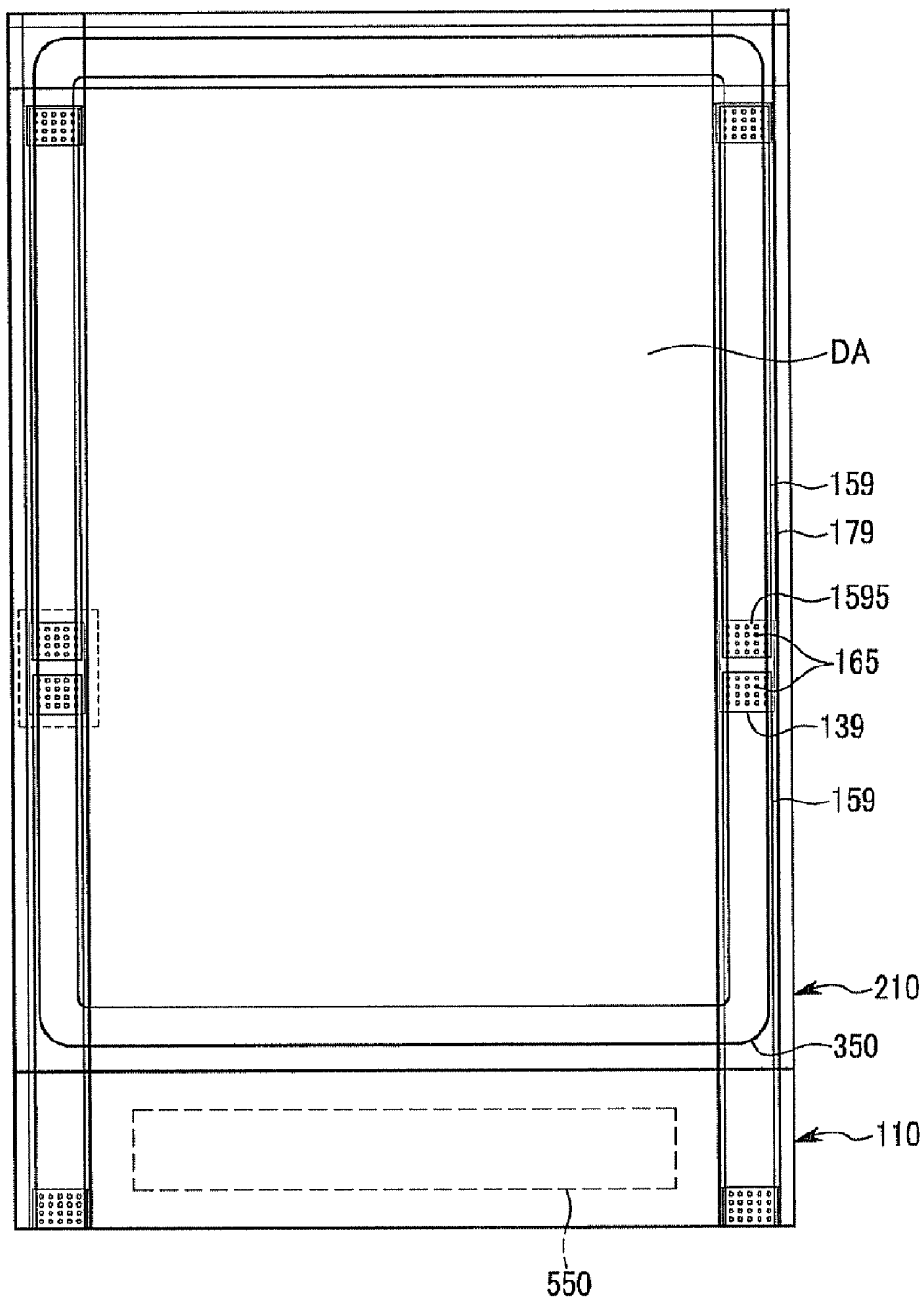
FIG. 1 is a top plan view of an organic light emitting diode (OLED) display according to the first exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In FIGS. 1-7, a size and a thickness of each element is approximately shown for better understanding and ease of description. Therefore, the aspects of the present invention are not limited to the drawings.

In the figures, the thickness of layers, films, panels, regions, etc., are exaggerated for clarity. Like reference numerals designate like elements throughout the specification. As referred to herein, when a first element is said to be disposed or formed "on", or "over", a second element, the first element can directly contact the second element, or can be separated from the second element by one or more other elements located therebetween. In contrast, when an element is referred to as being disposed or formed "directly on" or "directly over" another element, there are no intervening elements present.

To clearly explain aspects of the present invention, portions having no connection to the explanation are omitted, and the same or similar constituent elements are designated by the same reference numerals throughout the specification.

Also, the first exemplary embodiment will be described using like reference numerals for like constituent elements having the same structure in various exemplary embodiments. Other exemplary embodiments will be described based on differences from the first exemplary embodiment.

Although the accompanying drawings illustrate an active matrix (AM) type of OLED display having a 2Tr-1Cap structure in which two thin film transistors (TFT) and one capacitor are disposed in a pixel, aspects of the present invention are not limited thereto. Therefore, the OLED display may have various structures. For example, the OLED display may include three or more thin film transistors and two or more capacitors at one pixel, and may further include additional wires.

Here, the pixel is a minimum unit for displaying an image, and the OLED display displays an image through a plurality of pixels.

Hereinafter, an organic light emitting diode (OLED) display according to the first exemplary embodiment of the present invention will be described with reference to FIG. 1 to FIG. 5.

As shown in FIG. 1, the OLED display 100 according to the first exemplary embodiment of the present invention includes a display substrate 110, a sealing member 210 for covering the display substrate 110, and a sealant 350 disposed between the display substrate 110 and the sealing member 210.

The sealant 350 is disposed along an edge of the sealing member 210 and makes the display substrate 110 cohere with the sealing member 210. Hereinafter, an inner space between the substrate 110 and the sealing member 210 surrounded by the sealant 350 is referred to as a display area DA. The display area DA includes a plurality of pixels formed therein for displaying images.

The sealing member 210 is formed to have a smaller size than that of the display substrate 110. An integrated circuit chip 550 may be mounted at one edge of the display substrate 110 that is not covered by the sealing member 210.

The display substrate 110 includes a first conductive wire 159 and a second conductive wire 179. The first conductive wire 159 and the second conductive wire 179 are disposed at an edge of the display substrate 110. Therefore, the first conductive wire 159 and the second conductive wire 179 overlap with the sealant 350. The first conductive wire 159 and the second conductive wire 179 may not be elements for driving the OLED display 100 but, rather, may be used for an image quality test and an aging process in a fabricating process of the OLED display 100.

The first conductive wire 159 and the second conductive wire 179 are formed in parallel. In more detail, an interlayer insulating layer 160 (see FIG. 3) is formed over the first conductive wire 159, and the second conductive wire 179 is formed over the interlayer insulating layer 160.

Also, the first conductive wire 159 is broken at regular intervals, and an end of the broken first conductive wire 159 becomes a contact region 1595. The first conductive wire 159 includes at least one metal of chromium (Cr), molybdenum (Mo), titanium (Ti), or tantalum (Ta). The first conductive wire 159 is broken as described above to obtain durability and stability in consideration of characteristics and electrical resistance of a metal used for the first conductive wire 159.

The interlayer insulating layer 160 (see FIG. 3) includes a plurality of wire contact holes 165 that expose a part of the contact region of the first conductive wire 159. The second conductive wire 179 is connected to the first conductive wire 159 through the wire contact holes 165 of the interlayer insulating layer 160. Therefore, the first conductive wire 159, which is broken at predetermined intervals, is electrically connected to the second conductive wire 179.

Also, the display substrate 110 further includes a fill-up layer 139. The fill-up layer 139 is disposed over or under the contact region 1595 of the first conductive wire 159. In the OLED display 100 according to the first exemplary embodiment of the present invention, the fill-up layer 139 is disposed under the contact region 1595 of the first conductive wire 159.

Hereinafter, an internal structure of an OLED display 100 will be described based on a pixel formed in a display area (DA) with reference to FIG. 2 and FIG. 3.

Figure 2:
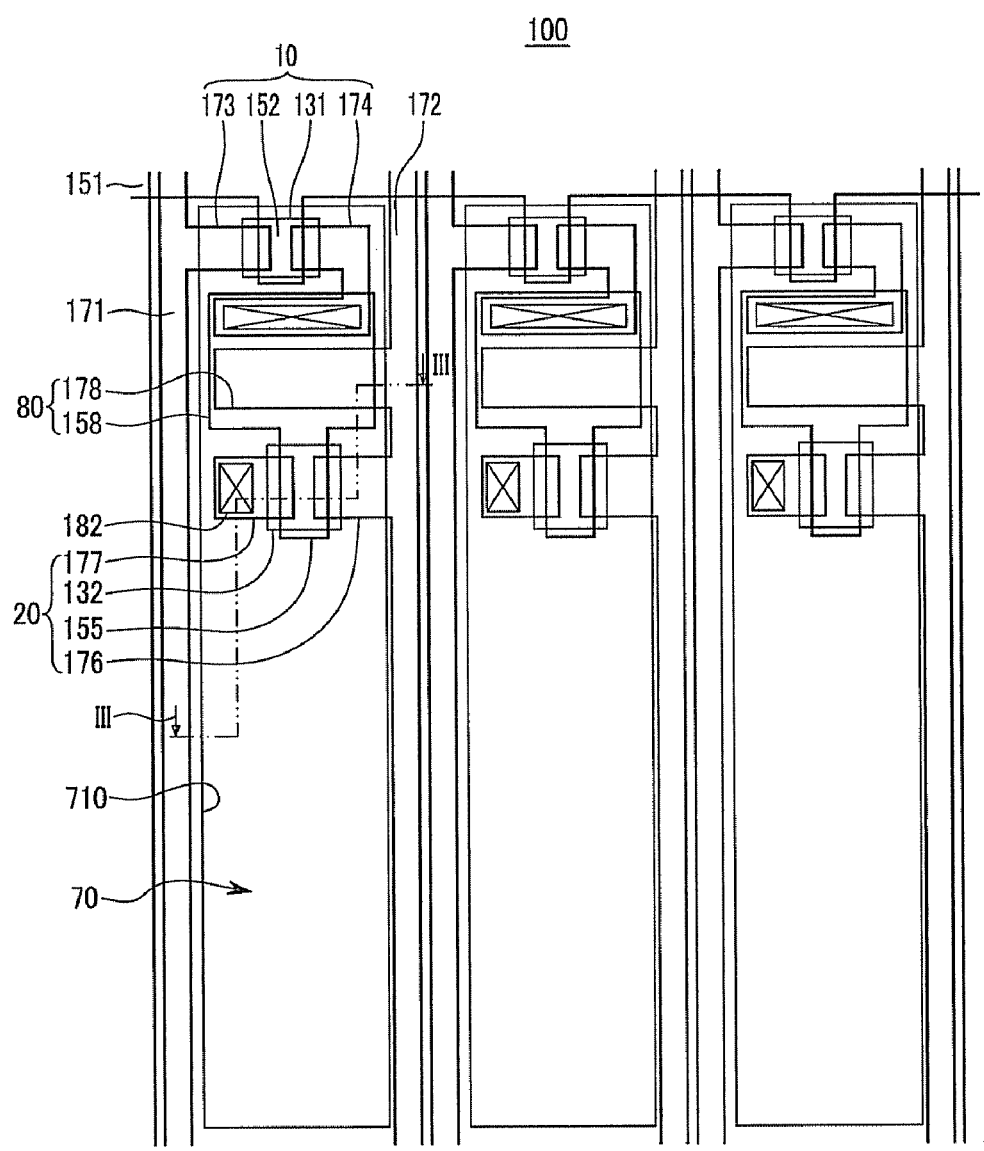
FIG. 2 is a partial magnified layout view of a display area of FIG. 1.

As shown in FIG. 2, the display substrate 110 includes a switching thin film transistor 10, a driving thin film transistor 20, a capacitor 80, and an organic light emitting diode (OLED) 70, which are formed in each of the pixels. The display substrate 110 further includes a gate line 151 disposed in one direction, and a data line 171 and a power line 172, which are insulated from the gate line 151 and cross the gate line 151. Here, one pixel may be defined by boundaries of the gate line 151, the data line 171, and the common power line 172. However, aspects of the present invention are not limited thereto.

Figure 3:
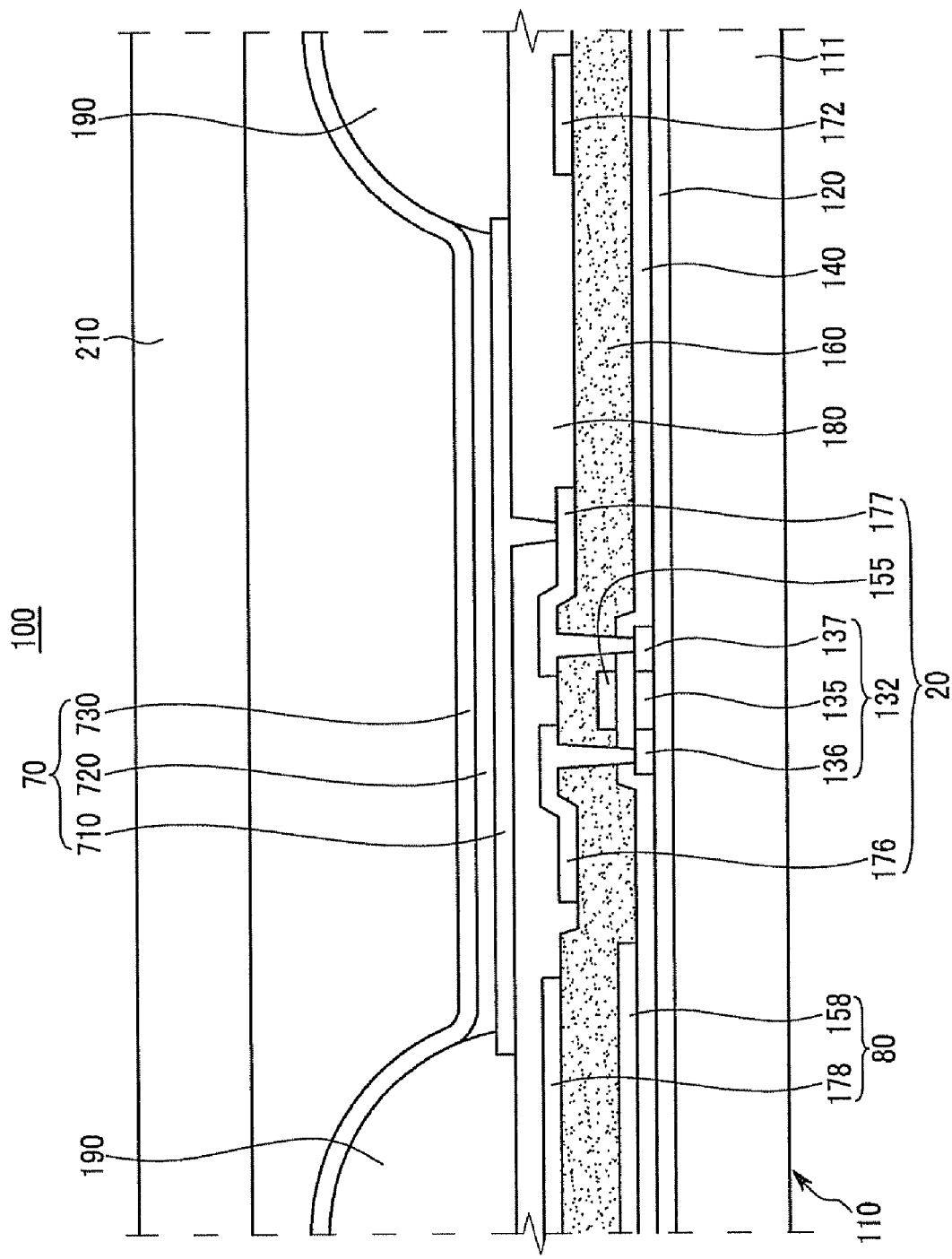
FIG. 3 is a cross-sectional view of FIG. 2 along the line III-III.

The organic light emitting diode 70 includes a first electrode 710, an organic emission layer 720 formed over the first electrode 710, and a second electrode 730 (see FIG. 3) formed over an organic emission layer 720 (see FIG. 3). Here, the first electrode 710 has positive polarity (+) as a hole injection electrode, and the second electrode 730 has negative polarity (−) as an electron injection electrode. However, the first exemplary embodiment of the present invention is not limited thereto. The first electrode 710 may be a cathode and the second electrode 730 may be an anode according to a driving method of the OLED display 100. Holes and electrons are injected into the inside of the organic emission layer 720 from the first electrode 710 and the second electrode 730. Excitons are formed when the injected holes are combined with the injected electrons, and light is emitted when an exited state of the excitons is dropped to a ground state.

As shown in FIG. 3, the capacitor 80 includes a first capacitor plate 158 and a second capacitor plate 178 with a gate insulating layer 140 interposed therebetween. Here, the gate insulating layer 140 is a dielectric material. Capacitance is determined by a charge accumulated in the capacitor 80 and a voltage between the first and second capacitor plates 158 and 178.

As shown in FIG. 2, the switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting a pixel to emit light. The switching gate electrode 152 is connected to the gate line 151. The switching source electrode 173 is connected to the data line 171. The switching drain electrode 174 is separated from the switching source electrode 173 and connected to the first capacitor plate 158.

The driving thin film transistor 20 applies a driving power to the first electrode 710 for controlling the organic emission layer 720 of the organic light emitting diode 70 in the selected pixel to emit light. The driving gate electrode 155 is connected to the first capacitor plate 158. The driving source electrode 176 and the second capacitor plate 178 are connected to the common power line 172, respectively. The driving drain electrode 177 is connected to the first electrode 710 of the organic light emitting diode 70 through the electrode contact hole 182.

By the described structure, the switching thin film transistor 10 is driven by a gate voltage applied to the gate line 151 and transfers a data voltage applied to the data line 171 to the driving thin film transistor 20. A voltage corresponding to a difference between a common voltage applied from the common power line 172 to the driving thin film transistor 20 and a data voltage transferred from the switching thin film transistor 10 is stored in the capacitor 80. The current corresponding to the stored voltage in the capacitor 80 flows to the organic light emitting diode 70 through the driving thin film transistor 20 so that the organic light emitting diode 70 emits light.

Hereinafter, a structure of an organic light emitting diode (OLED) display according to the first exemplary embodiment of the present invention will be described along a stacking order with reference to FIG. 3.

Also, a structure of a thin film transistor will be hereinafter described based on a driving thin film transistor 20. A switching thin film transistor 10 will also be briefly described based on a difference from the driving thin film transistor.

The display substrate 110 will be firstly described. A first substrate member 111 is an insulating substrate made of glass, quartz, ceramic, or plastic. However, aspects of the present invention are not limited thereto. Therefore, the first substrate member 111 may be a metallic substrate made of stainless steel.

A buffer layer 120 is formed over the first substrate member 111. The buffer layer 120 may be made of various materials that prevent impurity penetration and provide a level a surface thereof. For example, one of a silicon nitride layer (SiNx), a silicon oxide layer ($SiO_2$), and a silicon oxynitride layer (SiOxNy) is used as the buffer layer 120. However, since the buffer layer 120 is not an essential element, the buffer layer 120 may be omitted according to a type of substrate member 111 and a fabrication process condition.

The driving semiconductor layer 132 is formed over the buffer layer 120. The driving semiconductor layer 132 is formed as a polysilicon layer. Also, the driving semiconductor layer 132 includes a channel area 135, a source area 136, and a drain area 137. The source area 136 and the drain area 137 are disposed at both sides of the channel area 135. The channel area is not doped with an impurity, and the source area 136 and the drain area 137 are doped with a P-type impurity (p+). Here, the doped ion material is a P-type impurity such as boron (B). Generally, $B_2H_6$ is used. However, such an impurity may vary according to a type of a thin film transistor.

Although a thin film transistor having a PMOS structure using a P-type impurity is used as the driving thin film transistor 20 in the first exemplary embodiment of the present invention, aspects of the present invention are not limited thereto. Therefore, both of a thin film transistor having an NMOS structure and a thin film transistor having a PMOS structure can be used as the driving thin film transistor 20.

Although the driving thin film transistor 20 shown in FIG. 2 is a polycrystalline thin film transistor having a polysilicon layer, a switching thin film transistor 10 (not shown in FIG. 2) may be a polycrystal thin film transistor or an amorphous thin film transistor having an amorphous silicon layer.

A gate insulating layer 140 made of a silicon nitride (SiNx) or a silicon oxide ($SiO_2$) is formed over the driving semiconductor layer 132. A gate wire having the driving gate electrode 155 is formed over the gate insulating layer 140. Also, the gate wire further includes the gate line 151, the first capacitor plate 158, and other wires. The driving gate electrode 155 overlaps with at least a part of the driving semiconductor layer 132 and, particularly, overlaps with the channel area 135.

An interlayer insulating layer 160 is formed over the gate insulating layer 140, and the interlayer insulating layer 160 covers the driving gate electrode 155. The gate insulating layer 140 and the interlayer insulating layer 160 commonly include through-holes to expose the source region 136 and the drain region 137 of the driving semiconductor layer 132. The interlayer insulating layer 160 is made of a ceramic material such as silicon nitride (SiNx) or silicon oxide ($SiO_2$), like the gate insulating layer 140.

A data wire is formed over the interlayer insulating layer 160. The data wire includes the driving source electrode 176 and the driving drain electrode 177. The data wire further includes the data line 171, the common power line 172, the second capacitor plate 178, and other wires. The driving source electrode 176 and the driving drain electrode 177 are respectively connected to the source region 136 and the drain region 137 of the driving semiconductor layer 132 through through-holes formed in the interlayer insulating layer 160 and the gate insulating layer 140.

As described above, the driving thin film transistor 20 is formed including the driving semiconductor layer 132, the driving gate electrode 155, the driving source electrode 176, and the driving drain electrode 177. However, the structure of the driving thin film transistor 20 according to aspects of the present invention is not limited thereto. The structure of the driving thin film transistor 20 may be modified into various well-known structures that can be conveniently embodied by those skilled in the art.

Over the interlayer insulating layer 160, the planarization layer 180 is formed to cover the data wires 172, 176, 177, and 178. The planarization layer 180 removes steps and levels the surface to improve the luminous efficiency of the organic light emitting element 70. Also, the planarization layer 180 has a contact hole 182 to expose a part of the drain electrode 177.

The planarization layer 180 may be made of at least one of polyacrylate resins, epoxy resins, phenolic resins, polyamide resins, polyimide resins, unsaturated polyesters resins, polyphenylenether resins, polyphenylenesulfide resins, and benzocyclobutene (BCB).

Also, the first exemplary embodiment of the present invention is not limited to the above-described structure. One of the planarization layer 180 and the interlayer insulating layer 160 may be omitted.

A first pixel electrode 710 of the organic light emitting element 70 is formed over the planarization layer 180. That is, the organic light emitting diode (OLED) display 100 includes a plurality of the first electrodes 710 disposed at each of a plurality of pixels. The plurality of first electrodes 710 is disposed at a predetermined distance. The first electrodes 710 are connected to the drain electrode 177 through the electrode contact hole 182 of the planarization layer 180.

Also, the pixel defining layer 190 is formed over the planarization layer 180. The pixel defining layer 190 has an opening that exposes the pixel electrode 710. That is, the pixel defining layer 190 includes a plurality of openings formed at each of the pixels. The first electrode 710 is disposed corresponding to the opening of the pixel defining layer 190. However, it is not essential to dispose the first electrode 710 at the opening of the pixel defining layer 190. The first electrode 710 may be disposed under the pixel defining layer 190 to have a part overlapping with the pixel defining layer 190. The pixel defining layer 190 may be made of a resin such as acryl-based polyacrylates or polyimides, or a silica-type mineral.

An organic emission layer 720 is formed over the first electrode 710, and the second electrode 730 is formed over the organic emission layer 720. As described above, the organic light emitting diode 70 is formed having the first electrode 710, the organic emission layer 720, and the second electrode 730.

The organic emission layer 720 is made of a low molecular organic material or a high molecular organic material. The organic emission layer 720 is formed having multiple layers including a hole injection layer (HIL), a hole transport layer (HTL), an electron transport layer (ETL), and an electron injection layer (EIL). With regards to the organic emission layer 720 including all of the layers, the hole injection layer (HIL) is formed over the first electrode 710 which is an anode, the hole transport layer (HTL) is formed over the hole injection layer HIL, and the emission layer, the electron transport layer (ETL), and the electron injection layer (EIL) are sequentially stacked.

Although the organic emission layer 720 is disposed within the opening of the pixel defining layer 190, the first exemplary embodiment of the present invention is not limited thereto. Therefore, the organic emission layer 720 may be formed not only over the first electrode 710 in the opening of the pixel defining layer 190 but also between the pixel defining layer 190 and the second electrode 730. In more detail, the organic emission layer 720 may further include the hole injection layer (HIL), the hole transport layer (HTL), the electron transport layer (ETL), and the electron injection layer (EIL) with the emission layer. Excluding the emission layer, the hole injection layer (HIL), the hole transport layer (HTL), the electron transport layer (ETL), and the electron injection layer (EIL) may be formed not only over the first electrode 710 but also over the pixel defining layer 190 using an open mask. That is, at least one of the layers included in the organic emission layer 720 may be disposed between the pixel defining layer 190 and the second electrode 730.

The first electrode 710 and the second electrode 730 may be made of a transparent conductive material, a translucent conductive material, or a reflective conductive material. The type of the OLED display 100 is determined according to a type of material used to form the first electrode 710 and the second electrode 730, wherein the type is a top emission type, a bottom emission type, or a dual emission type.

As the transparent conductive material, indium tin oxide (ITO), indium zinc oxide (IZO), zinc oxide (ZnO), or indium oxide ($In_2O_3$) may be used. As the reflective material and the translucent material, lithium (Li), calcium (Ca), lithium/calcium fluoride (LiF/Ca), lithium/aluminum fluoride (LiF/Al), aluminum (Al), silver (Ag), magnesium (Mg), or gold (Au) may be used.

A sealing member 210 is arranged opposite to and over the second electrode 730. The sealing member 210 is made of transparent material such as glass or plastic. The sealing member 210 coheres with the display substrate 110 through the sealant 350 (see FIG. 1) formed along the edge.

Hereinafter, an internal structure of an organic light emitting diode (OLED) display 100 will be described based on a contact region 1595 of the first conductive wire 159 with reference to FIG. 4 and FIG. 5.

Figure 4:
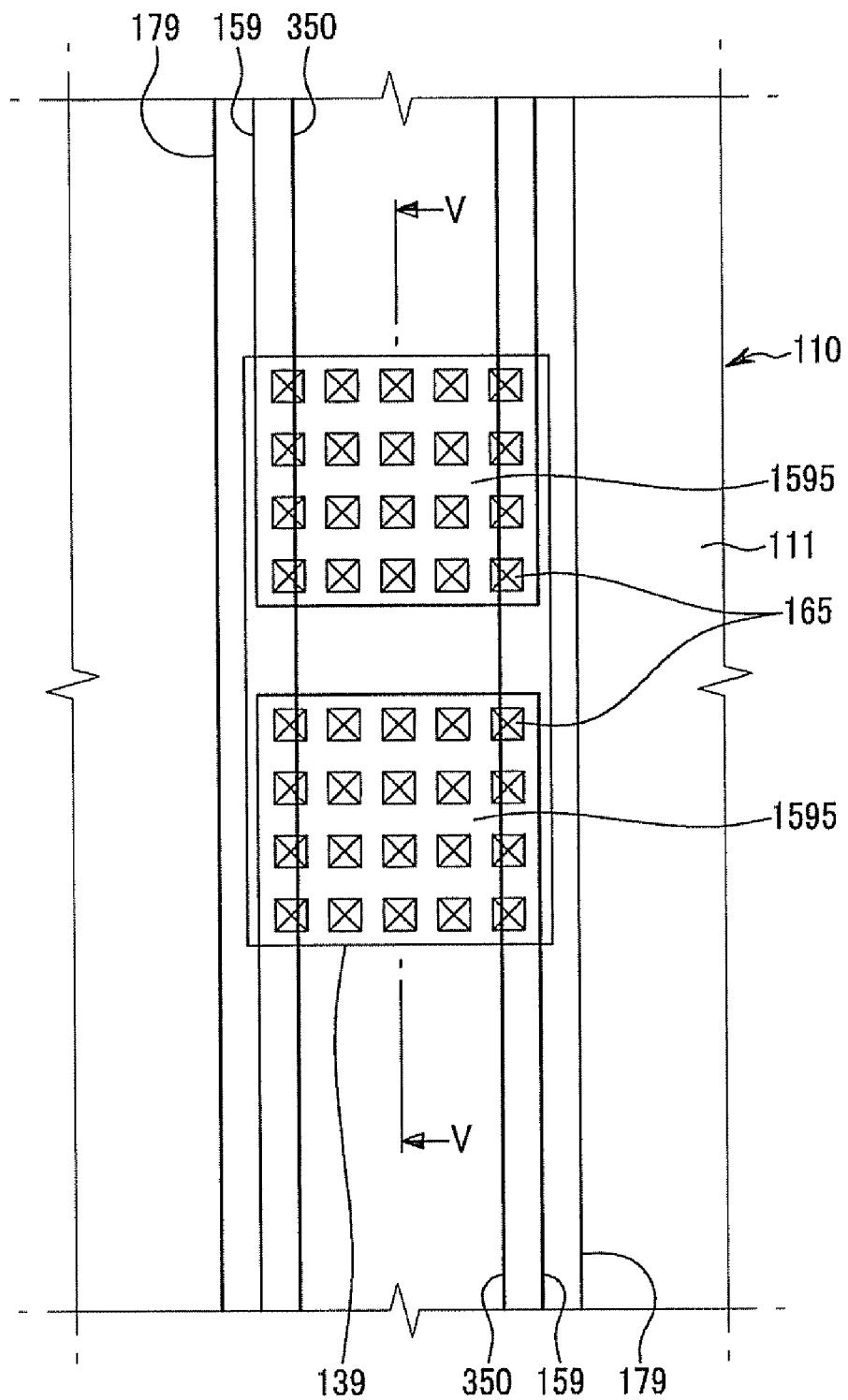
FIG. 4 is a partial magnified layout of an area of FIG. 1 having a sealant.

As shown in FIG. 4 and FIG. 5, a buffer layer 120 is formed over the substrate member 111. A fill-up layer 139 is formed over the buffer layer 120. Here, the fill-up layer 139 is formed only at a region corresponding to the contact region 1595 of the first conductive wire 159. Also, the fill-up layer 139 is formed in the same layer of the semiconductor layer 320 of the thin film transistor 20 formed in the display area (DA) using the same material, that is, the fill-up layer 139 is formed without an additional process.

A gate insulating layer 140 is formed over the buffer layer 120 and the fill-up layer 139. The first conductive wire 159 is formed over the gate insulating layer 140. The first conductive wire 159 is formed of the same material of the gate electrode 155, the gate line 151, and the first capacitor plate 158 through the same manufacturing process. The first conductive wire 159 includes at least one of metals such as chromium (Cr), molybdenum (Mo), titanium (Ti), and tantalum (Ta).

The first conductive wire 159 includes a contact region 1595. Also, the first conductive wire 159 is broken at regular intervals. Here, one end of broken first conductive wire 159 becomes the contact region 1595.

An interlayer insulating layer 160 is formed over the first conductive wire 159. The interlayer insulating layer 160 includes a plurality of wire contact holes exposing a part of the contact region 1595 of the first conductive wire 159. Here, a thickness t1 of the interlayer insulating layer 160 over the contact region 1595 having a plurality of wire contact holes 165 is thinner than the average thickness of the interlayer insulating layer 160. This is because the interlayer insulating layer 160 around the wire contact holes 165 is partially etched while the plurality of wire contact holes 165 are formed. Therefore, the thickness t1 of the interlayer insulating layer 160 formed over the contact region 1595 is different from a thickness t2 of the interlayer insulating layer 160 not formed over the contact region 1595. Here, the fill-up layer 139 is formed under the contact region 1595 to supplement the interlayer insulating layer 160 over the contact region 1595 at which location the interlayer insulating layer 160 has a comparatively thinner thickness t1. That is, the fill-up layer 139 suppresses a great step from forming by a thickness difference of the interlayer insulating layer 160.

A second conductive wire 179 is formed over the interlayer insulating layer 160. The second conductive wire 179 is connected to the first conductive wire 159 through the wire contact hole 165 of the interlayer insulating layer 160.

A sealant 350 is formed over the second conductive wire 179, and a sealing member 210 is attached on the sealant 350. Also, the sealant 350 is made of ceramic material. For example, the sealant 350 may be made of frit. In more detail, the sealant 350 includes one side contacting the sealing member 210 and the other side contacting the second conductive wire 179 and a part of the interlayer insulating layer 160 where the second conductive wire 179 is not formed. Accordingly, the sealant 350 makes the sealing member 210 cohere with the display substrate 110.

As described above, the second conductive wire 179 contacting the sealant 350 is formed to be comparatively flat without a large step-up from the fill-up layer 139 disposed below. Therefore, it prevents the adherence of the sealant 350 from deterioration caused by the step. Accordingly, the strength of the OLED display 100 can be improved by suppressing the sealing member 210 from coming off from the display substrate 110.

Hereinafter, an organic light emitting diode (OLED) display 200 according to the second exemplary embodiment of the present invention will be described with reference to FIG. 6.

As shown in FIG. 6, the OLED display 200 according to the second exemplary embodiment of the present invention includes a fill-up layer 189 disposed over a contact region 1595 of a first conductive wire 159.

In more detail, the fill-up layer 189 is disposed between the second conductive wire 179 and the sealant 350. Here, the fill-up layer 189 is formed only at a region corresponding to the contact region 1595 of the first conductive wire 159. Also, the fill-up layer 189 is formed of the same material of a planarization layer 180 formed in a display area (DA) through the same manufacturing process.

Further, a thickness t1 of the interlayer insulating layer 160 formed over the contact region 1595 is thinner than a thickness t2 of the interlayer insulating layer 160 not formed over the contact region 1595.

As described above, the fill-up layer 189 supplements the interlayer insulating layer 160 over the contact region 1595 that has the comparatively thinner thickness t1. That is, the fill-up layer 189 fills up a step formed by a thickness difference of the interlayer insulating layer 160. That is, the second conductive wire 179 contacting the sealant 350 and the fill-up layer 189 are formed to be comparatively flat without a step. Accordingly, adherence of the sealant 350 is prevented from deterioration caused by a step. Therefore, the strength of the OLED display 200 is improved by suppressing the sealing member 210 from coming off from the display substrate 110.

Hereinafter, an organic light emitting diode (OLED) display 300 according to the third exemplary embodiment of the present invention will be described with reference to FIG. 7.

As shown in FIG. 7, the OLED display 300 according to the third exemplary embodiment of the present invention includes a fill-up layer 719 that is disposed over a contact region 1595 of a first conductive wire 159.

In more detail, the fill-up layer 719 is disposed between a second conductive wire 179 and a sealant 350. Here, the fill-up layer 719 is formed only at a region corresponding to the contact region 1595 of the first conductive wire 159. Also, the fill-up layer 719 is formed of the same material of the first electrode 710 of the OLED 70 formed in a display area (DA) through the same manufacturing process.

Also, a thickness t1 of an interlayer insulating layer 160 formed over the contact region 1595 is thinner than a thickness t2 of the interlayer insulating layer 160.

As described above, the fill-up layer 719 supplements the interlayer insulating layer 160 formed over the contact region 1595 that has a comparatively thinner thickness t1. That is, the fill-up layer 719 fills up a step formed by a thickness difference of the interlayer insulating layer 160. In other words, the second conductive wire 179 contacting the sealant 350 and the fill-up layer 719 are formed to be comparatively flat without a great step. Accordingly, it prevents the adherence of the sealant 350 from deterioration due to the step difference. Therefore, the strength of the OLED display 300 is improved by suppressing the sealing member 210 from coming off from the display substrate 110.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display, the OLED display having a peripheral edge region surrounding and being external to an image producing display region, the peripheral edge region comprising:
    a first substrate member;
    a buffer layer arranged over the first substrate;
    a first conductive wire having a contact region and arranged over the first substrate member;
    an insulating layer including a plurality of wire contact holes exposing a part of the contact region of the first conductive wire and arranged over the first conductive wire;
    a second conductive wire arranged over the first conductive wire and connected to the first conductive wire through the plurality of wire contact holes of the insulating layer;
    a sealant arranged over the second conductive wire;
    a sealing member arranged over the sealant; and
    a fill-up layer arranged above or under the contact region of the first conductive wire, the buffer layer being underneath the sealant.

2. The OLED display of claim 1, wherein the insulating layer disposed over the contact region having the plurality of wire contact holes has a thickness external to the wire contact holes that is less than an average thickness of the insulating layer.

3. The OLED display of claim 2, wherein the first conductive wire is broken at regular intervals.

4. The OLED display of claim 3, wherein the contact region is an end of the broken first conductive wire.

5. The OLED display of claim 3, wherein the first conductive wire includes at least one metal selected from a group consisting of chromium (Cr), molybdenum (Mo), titanium (Ti), and tantalum (Ta).

6. The OLED display of claim 2, wherein the first conductive wire and the second conductive wire are formed to be flat.

7. The OLED display of claim 1, wherein the fill-up layer is disposed under the first conductive wire.

8. The OLED display of claim 7, wherein the image producing display region comprises a thin film transistor having a semiconductor layer, wherein the fill-up layer in the peripheral edge region is comprised of the same material as that of the semiconductor layer of the thin film transistor and is produced through the same manufacturing process.

9. The OLED display of claim 3, the regular intervals of the first conductive wire terminate at one of a plurality of contact regions, the regular intervals being electrically connected to each other by a second conductive wire.

10. An organic light emitting diode (OLED) display, comprising:
a first substrate member;
a buffer layer arranged over the first substrate;
a first conductive wire having a contact region and arranged over the first substrate member;
an insulating layer including a plurality of wire contact holes exposing a part of the contact region of the first conductive wire and arranged over the first conductive wire;
a second conductive wire arranged over the first conductive wire and connected to the first conductive wire through the plurality of wire contact holes of the insulating layer;
a sealant arranged over the second conductive wire;
a sealing member arranged over the sealant; and
a fill-up layer arranged on the buffer layer and disposed above or under the contact region of the first conductive wire, wherein the insulating layer disposed over the contact region having the plurality of wire contact holes has a first thickness t1 that is greater than zero but less than a second thickness t2 of the insulating layer external to the contact region, and wherein the fill-up layer is only within the contact region to compensate for a step difference between portions of the insulating layer in the contact region having the first thickness t1 and portions of the insulating layer external to the contact region having the second thickness t2.

11. The OLED display of claim 10, the fill-up layer being arranged only in a region corresponding to where the insulating layer has the first thickness t1 and being absent at regions of the display where the insulating layer has the second thickness t2.

12. The OLED display of claim 10, the fill-up layer having a thickness about equal to a difference between the second thickness t2 and the first thickness t1 of the insulating layer.

13. The OLED display of claim 10, the first conductive wire and the second conductive wire being used for image quality test and an aging process during a fabrication of the OLED display and are not elements for driving the OLED display.

14. The OLED display of claim 10, the fill-up layer being arranged between the second conductive wire and the sealant.

15. The OLED display of claim 14, the fill-up layer being arranged only at a location corresponding to where the insulating layer has a first thickness t1 and not at locations corresponding to where the insulating layer has a second thickness t2.

16. The OLED of claim 14, the fill-up layer being comprised of a material selected from a group consisting of a polyacrylate resin, an epoxy resins, a phenolic resin, a polyamide resin, a polyimide resin, an unsaturated polyesters resin, a polyphenylenether resin, a polyphenylenesulfide resin, and benzocyclobutene (BCB).

17. The OLED of claim 14, the fill-up layer being comprised of a material selected from a group consisting of indium tin oxide (ITO), indium zinc oxide (IZO), zinc oxide (ZnO), or indium oxide ($In_2O_3$), lithium (Li), calcium (Ca), lithium/calcium fluoride (LiF/Ca), lithium/aluminum fluoride (LiF/Al), aluminum (Al), silver (Ag), magnesium (Mg) and gold (Au).

18. The OLED display of claim 1, the sealant being comprised of frit and including one side that contacts the sealing member and an other side that contacts a substantially flat structure.

19. The OLED display of claim 1, the sealant being comprised of frit and including one side that contacts the sealing member and an other side that contacts a substantially flat structure caused by the fill-up layer canceling out the step difference of the insulating layer.

20. The OLED display of claim 7, the buffer layer being comprised of a material selected from a group consisting of $SiN_x$, $SiO_2$, and $SiO_xN_y$.

* * * * *